United States Patent
Suzuki et al.

(10) Patent No.: US 8,423,173 B2
(45) Date of Patent: Apr. 16, 2013

(54) LOAD PORT APPARATUS, LID MEMBER MOUNTING AND DISMOUNTING APPARATUS FOR LOAD PORT APPARATUS, AND CONTROLLING METHOD FOR LIFTING MECHANISMS OF MAPPING APPARATUS

(75) Inventors: Kensuke Suzuki, Toyohashi (JP); Fuminori Asa, Toyohashi (JP); Yuuki Taira, Toyohashi (JP)

(73) Assignee: Sinfonia Technology Co., Ltd., Tokyo (JP)

( * ) Notice: Subject to any disclaimer, the term of this patent is extended or adjusted under 35 U.S.C. 154(b) by 406 days.

(21) Appl. No.: 12/833,119

(22) Filed: Jul. 9, 2010

(65) Prior Publication Data

US 2011/0005868 A1  Jan. 13, 2011

(30) Foreign Application Priority Data

Jul. 10, 2009 (JP) ................................ 2009-163347

(51) Int. Cl.
*H01L 21/677* (2006.01)
*B65G 65/34* (2006.01)
*G06F 19/00* (2006.01)
*G06F 7/00* (2006.01)

(52) U.S. Cl.
USPC ........... 700/213; 700/121; 700/117; 700/118; 700/228; 414/217; 414/411

(58) Field of Classification Search .................. None
See application file for complete search history.

(56) References Cited

U.S. PATENT DOCUMENTS

| 2003/0211812 | A1* | 11/2003 | Isobe et al. ................. 451/5 |
| 2004/0083955 | A1* | 5/2004 | Ramsay ...................... 118/500 |
| 2007/0093186 | A1* | 4/2007 | Isobe et al. ................ 451/54 |
| 2007/0264914 | A1* | 11/2007 | Isobe et al. ............... 451/54 |

FOREIGN PATENT DOCUMENTS

JP  2006-173510  6/2006

OTHER PUBLICATIONS

U.S. Appl. No. 13/204,865, filed Aug. 8, 2011, Asa, et al.

* cited by examiner

*Primary Examiner* — Gene Crawford
*Assistant Examiner* — Yolanda Jones
(74) *Attorney, Agent, or Firm* — Oblon, Spivak, McClelland, Maier & Neustadt, L.L.P.

(57) ABSTRACT

A load port apparatus is disclosed wherein the total period of time of operation of a lid member mounting and dismounting apparatus and a mapping apparatus is minimized while avoiding interference of the two apparatus with each other. An interference avoiding sensor apparatus is provided on the lid member mounting and dismounting apparatus and the mapping apparatus and detects that a lid member suction plate of the lid member mounting and dismounting apparatus is disposed at a position lower by a value exceeding a preset value than the arm to which the mapping sensors are attached to enable pivotal motion of the arm without interfering with the lid member suction plate. Then, immediately after the preset value is detected by the interference avoiding sensor apparatus, the arm is pivoted to the mapping position to start the mapping.

12 Claims, 11 Drawing Sheets

LOAD PORT APPARATUS, LID MEMBER MOUNTING AND DISMOUNTING APPARATUS FOR LOAD PORT APPARATUS, AND CONTROLLING METHOD FOR LIFTING MECHANISMS OF MAPPING APPARATUS

BACKGROUND OF THE INVENTION

1. Field of the Invention

This invention relates to a load port apparatus which includes a lid member mounting and dismounting apparatus for mounting and dismounting a lid member on and from a carrier cassette, a mapping apparatus for carrying mapping and a plurality of lifting mechanisms for the lid member mounting and dismounting apparatus and the mapping apparatus, and a controlling method for the lifting mechanisms.

2. Description of the Related Art

A load port apparatus includes a cassette table, a lid member mounting and dismounting apparatus and a mapping apparatus as disclosed in Japanese Patent Laid-Open No. 2006-173510. The cassette table is disposed horizontally on a load port frame disposed vertically and is configured to receive a carrier cassette placed thereon. The lid member mounting and dismounting apparatus includes a lid member suction plate which in turn includes a locking and unlocking mechanism and a suction cup and is mounted for upward and downward movement on the load port frame in order to mount and dismount the lid member on and from an opening of the carrier cassette. The mapping apparatus includes a substrate detection sensor disposed for retracting movement from a detection position for a group of substrates opposed to the opening of the carrier cassette and a second lifting mechanism different from a first lifting mechanism for the lid member mounting and dismounting apparatus and operable to move the substrate detection sensor upwardly and downwardly so that the substrate detection sensor carries out mapping which is detection of presence or absence of a substrate on each shelf of the carrier cassette. The load port apparatus is removably attached to the outer side of a substrate processing apparatus such that it operates from the inner side of the substrate processing apparatus to take a substrate into and out of the carrier cassette.

It is to be noted that, in the load port apparatus of an object of the present invention, a carrier cassette called FOUP cassette which has an opening only on one side, that is, on the front side, thereof is used. Therefore, the carrier cassette is disposed with the opening thereof directed to the substrate processing apparatus side, and a lid member is detached from the carrier cassette by a lid member mounting and dismounting apparatus. Thereafter, mapping of substrates on the shelves of the carrier cassette is carried out by the mapping apparatus, and then the substrates are taken out one by one from the carrier cassette and processed in the substrate processing apparatus. Then, the substrates after processed are successively placed on the shelves of the carrier cassette through the opening of the carrier cassette, and then mapping of the substrates on the shelves is carried out by the mapping apparatus. Thereafter, the opening of the carrier cassette is closed up with the lid member by the lid member mounting and dismounting apparatus, and then the entire carrier cassette is transported to a next processing step.

In a load port apparatus which has lifting mechanisms independently of each other for the lid member mounting and dismounting apparatus and the mapping mechanism, if both apparatus are moved up or down at the same time, then they sometimes interfere with each other at individually particular portions thereof. Therefore, the lifting mechanisms for the different apparatus are rendered operative separately in time to avoid such interference. Where the lifting apparatus for the different apparatus are rendered operative separately, the total time period required for the operation of dismounting and mounting of the lid member from and on the carrier cassette and mapping of wafers in the carrier cassette is the sum of periods of time required for the upward and downward movements of the different apparatus. Therefore, where the lifting mechanisms for the different apparatus are rendered operative separately, the total time period mentioned is elongated.

In processing of substrates, dismounting and mounting of a lid member from and on a carrier cassette and mapping of the substrates are not operation originally required for processing of the substrates but are auxiliary or confirmatory operation required inevitably in order to carry out original processing operation. Therefore, it is demanded to minimize the time required for the dismounting and mounting operation and the mapping operation.

SUMMARY OF THE INVENTION

It is an object of the present invention to provide a load port apparatus wherein the total period of time of operation of a lid member mounting and dismounting apparatus and a mapping apparatus for which lifting apparatus are provided independently of each other is minimized while avoiding interference of the two apparatus with each other.

In order to achieve the object described above, according to the present invention, the periods of time of operation of the two apparatus, particularly, the periods of time required for dismounting and mounting of a lid member from and on a carrier cassette and for mapping, are overlapped with each other as long as possible or overlapped in most part thereof with each other.

More particularly, according to an aspect of the present invention, there is provided a load port apparatus including a cassette table disposed horizontally on a load port frame disposed vertically and adapted to receive a carrier cassette placed thereon, a lid member mounting and dismounting apparatus including a lid member suction plate, which in turn includes a locking and unlocking mechanism for locking and unlocking a lid member to and from an opening of the carrier cassette placed on the cassette table and a suction cup, mounted on the load port frame for upward and downward movement by a first lifting mechanism for dismounting and mounting the lid member to and from the opening of the carrier cassette, a mapping apparatus having an L-shaped arm having a horizontal portion and a vertical portion and a pair of optical mapping sensors attached to the horizontal portion of the arm in such a manner as to project toward the carrier cassette, the arm being disposed for pivotal motion by a small amount around a horizontal pivotal motion axis provided in parallel to the horizontal portion of the arm in the proximity of a lower end portion of the vertical portion of the arm to carry out mapping for a substrate group in the carrier cassette, the mapping apparatus being moved upwardly and downwardly by a second lifting mechanism, the load port apparatus being removably attached to the outer side of a substrate processing apparatus for taking a substrate into and out of the carrier cassette from the inner side of the substrate processing apparatus, and an interference avoiding sensor apparatus provided on the lid member mounting and dismounting apparatus and the mapping apparatus and adapted to detect that the lid member suction plate is disposed at a position lower by a value exceeding a preset value than the arm to which the mapping sensors are attached to enable the pivotal motion of the arm without interfering with the lid member suction plate, the arm being pivoted, immediately after the preset value is detected by the interference avoiding sensor apparatus, to the mapping position to start the mapping such that operation time periods of the lid member mounting and dismounting apparatus and the mapping apparatus overlap in most part thereof with each other to achieve reduction of the total time period required for the dismounting and mounting of the lid member from and to the carrier cassette and the mapping.

In the load port apparatus, the interference avoiding sensor apparatus for detecting that the lid member suction plate is disposed at the position lower by a value exceeding the preset value than the arm to which the mapping sensors are attached to enable the pivotal motion of the arm without interfering with the lid member suction plate is provided on the lid member mounting and dismounting apparatus and the mapping apparatus. Therefore, at a point of time after the interference avoiding sensor apparatus is turned off and the possibility in interference between the lid member suction plate and the arm is eliminated, the arm in a stopping state with the paired mapping sensors attached thereto is pivoted from the non-mapping position to the mapping position. Thereafter, the arm is moved down by the second lifting mechanism to carry out mapping for the substrates in the carrier cassette.

Therefore, dismounting and mounting of the lid member from and on the carrier cassette placed on the cassette table and mapping of the substrates on the shelves of the carrier cassette can be carried out such that the operation time periods of the lid member mounting and dismounting apparatus and the mapping apparatus overlap in most part thereof with each other. Therefore, the total operation time period of the lid member mounting and dismounting apparatus and the mapping apparatus which are individually moved up and down by the lifting mechanisms independent of each other can be reduced.

The interference avoiding sensor apparatus may include a light blocking plate having a predetermined length along an upward and downward direction and attached integrally to an upwardly and downwardly movable portion of one of the mapping apparatus and the lid member mounting and dismounting apparatus and a pair of optical sensors disposed at an upwardly and downwardly movable portion of the other one of the mapping apparatus and the lid member mounting and dismounting apparatus in such a manner as to sandwich the light blocking member therebetween.

In the load port apparatus, the length of the light blocking plate of the interference avoiding sensor apparatus is a minimum length by which the lid member suction plate and the arm should be disposed in an upwardly and downwardly spaced relationship from each other in order to avoid interference between the lid member suction plate and the arm. Thus, the interference avoiding sensor apparatus makes it possible to allow the operation time periods of the lid member mounting and dismounting apparatus and the mapping apparatus to overlap in most part thereof with each other while readily avoiding otherwise possible interference between the lid member suction plate and the arm of the mapping apparatus.

Preferably, the first lifting mechanism for the lid member mounting and dismounting apparatus includes an air cylinder, and the second lifting mechanism for the mapping apparatus includes a ball screw mechanism.

In the load port apparatus, the lid member mounting and dismounting apparatus moves the lid member suction plate, which is moved toward and away from the carrier cassette at the upward movement end thereof, and stops the lid member suction plate at each of the upward movement end and the downward movement end thereof. Thus, the lid member suction plate need not be stopped at any intermediate position. Therefore, the air cylinder is suitable driving means for the lid member mounting and dismounting apparatus. Meanwhile, since it is necessary for the arm, to which the mapping sensors of the mapping apparatus are attached, to temporarily stop the mapping sensors at a position a little higher than the substrate on the uppermost shelf in the carrier cassette and then move the mapping sensors toward and away from the carrier cassette, it is essentially required that the temporary stopping position can be detected accurately. The ball screw position is suitable for achieving the function just described.

According to another aspect of the present invention, there is provided a controlling method for controlling the first and second lifting mechanisms in the load port apparatus described above so that the operation time periods of the lid member mounting and dismounting apparatus and the mapping apparatus of the load port apparatus overlap in most part thereof with each other to achieve reduction of the total time period required for the dismounting and mounting of the lid member from and to the carrier cassette and the mapping, the controlling method including the steps of controlling, upon the downward movement of the lid member suction plate and the arm, the movement of the lid member suction plate to a speed equal to or a little lower than that of the arm, controlling the lid member suction plate to continuously move at the fixed speed by the first lifting mechanism, and controlling, when the interference avoiding sensor apparatus detects that, in a state wherein the mapping sensors are disposed at the position a little above a substrate supported on the uppermost shelf in the carrier cassette and the arm stops temporarily, the lid member suction plate is disposed at the position lower by the value exceeding the preset value than the arm to which the mapping sensors are attached, the second lifting mechanism so that the arm is pivoted to the mapping position without interfering with the lid member suction plate and then starts downward movement to carry out mapping of the substrates in the carrier cassette.

With the controlling method, the first and second lifting mechanisms for moving the lid member mounting and dismounting apparatus and the mapping apparatus upwardly and downwardly, respectively, in the load port apparatus are controlled appropriately.

Preferably, upon the upward movement of the lid member suction plate and the arm, the speed of the upward movement of the lid member suction plate is lower than the speed of the upward movement of the arm.

With the controlling method, when mapping for the substrates in the carrier cassette is carried out while the arm of the mapping apparatus moves upwardly, otherwise possible interference between the arm and the lid member suction plate of the lid member mounting and dismounting apparatus can be avoided.

Preferably, the lid member suction plate and the arm start the upward movement at the same time.

With the controlling method, the total operation time period of the lid member mounting and dismounting apparatus and the mapping apparatus becomes equal to the operation time period of the lid member mounting and dismounting apparatus whose operation time period is comparatively long. Consequently, the total operation time period is minimized.

The lid member suction plate and the arm may start the downward movement at the same speed at the same time.

With the controlling method, even if the lid member mounting and dismounting apparatus and the arm start downward movement at the same time at the same speed, the arm may start, after it reaches the temporary stopping position, its pivotal movement so that the paired mapping sensors may be disposed at the mapping position at a point of time at which it is detected by the interference avoiding sensor apparatus that the lid member suction plate is moved down to the position at which interference thereof with the arm can be avoided. Therefore, the total operation time period of the lid member mounting and dismounting apparatus and the mapping apparatus becomes equal to the operation time period of the lid member mounting and dismounting apparatus whose operation time period is comparatively long. Consequently, the total operation time period is minimized. Further, since the speed of the downward movement of the lid member suction plate is selectively set to the lowest speed, appearance of vibrations and so forth is minimized, and consequently, the accuracy in mapping is enhanced.

In summary, with the load port apparatus and the controlling method, where the arm of the mapping apparatus is pivoted to the mapping position during temporary stopping of the arm, also the temporary stopping time period of the arm can be minimized and the operation time periods of the two apparatus can be made overlap in most part thereof with each other by the interference avoiding sensor provided on the lid member mounting and dismounting apparatus and the mapping apparatus. As a result, the total time period required for the operations where the opening of the carrier cassette is closed up with the lid member after the lid member is dismounted from the carrier cassette and mapping of substrates, which are not processed as yet, on individual shelves of the carrier cassette is carried out or after substrates after processed are accommodated into the shelves of the carrier cassette and mapping for the substrates on the shelves is carried out can be reduced.

The above and other objects, features and advantages of the present invention will become apparent from the following description and the appended claims, taken in conjunction with the accompanying drawings in which like parts or elements denoted by like reference symbols.

DETAILED DESCRIPTION OF THE PREFERRED EMBODIMENT

Figure 1:
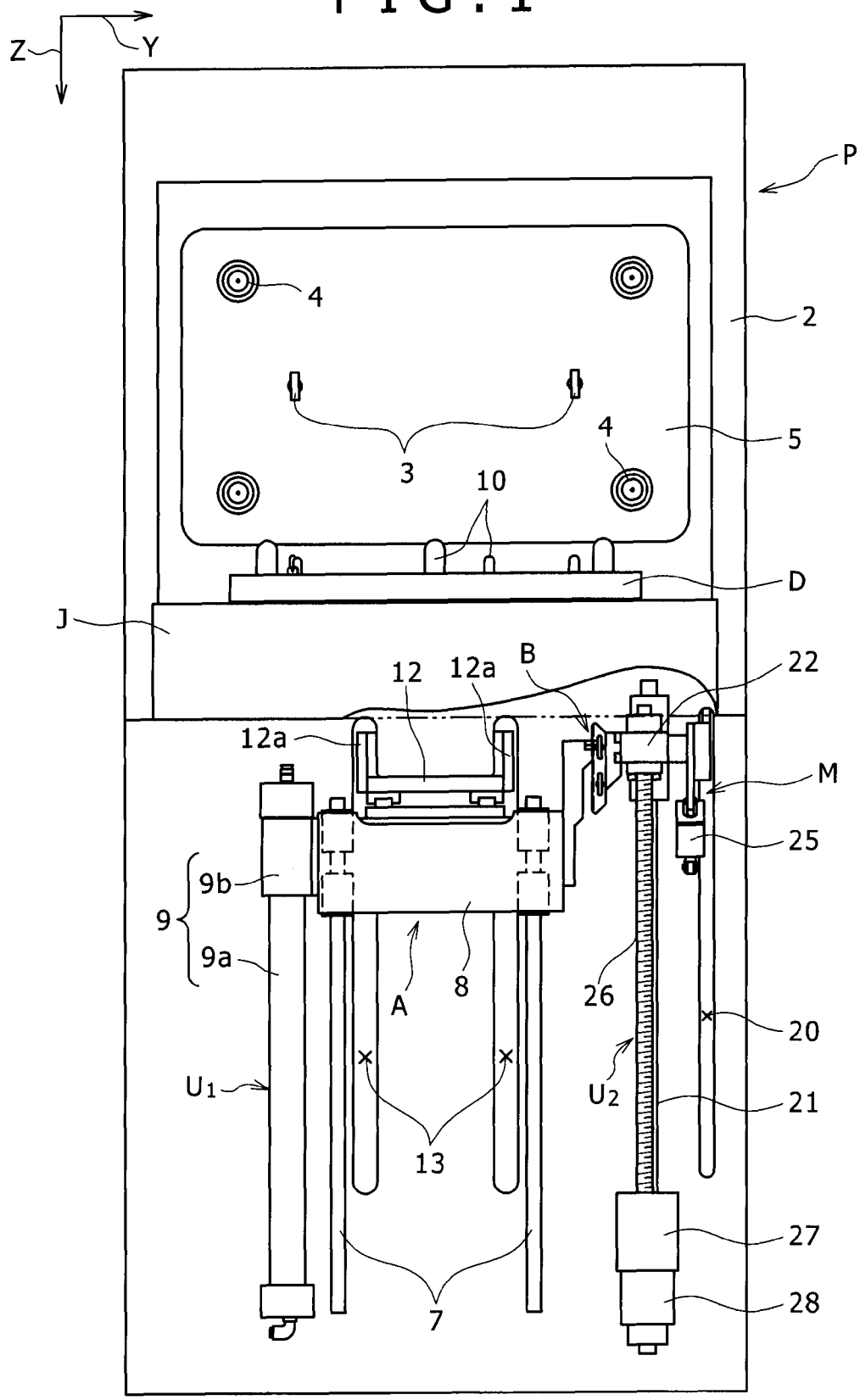
FIG. 1 is a front elevational view of a load port apparatus according to the present invention.
Figure 2:
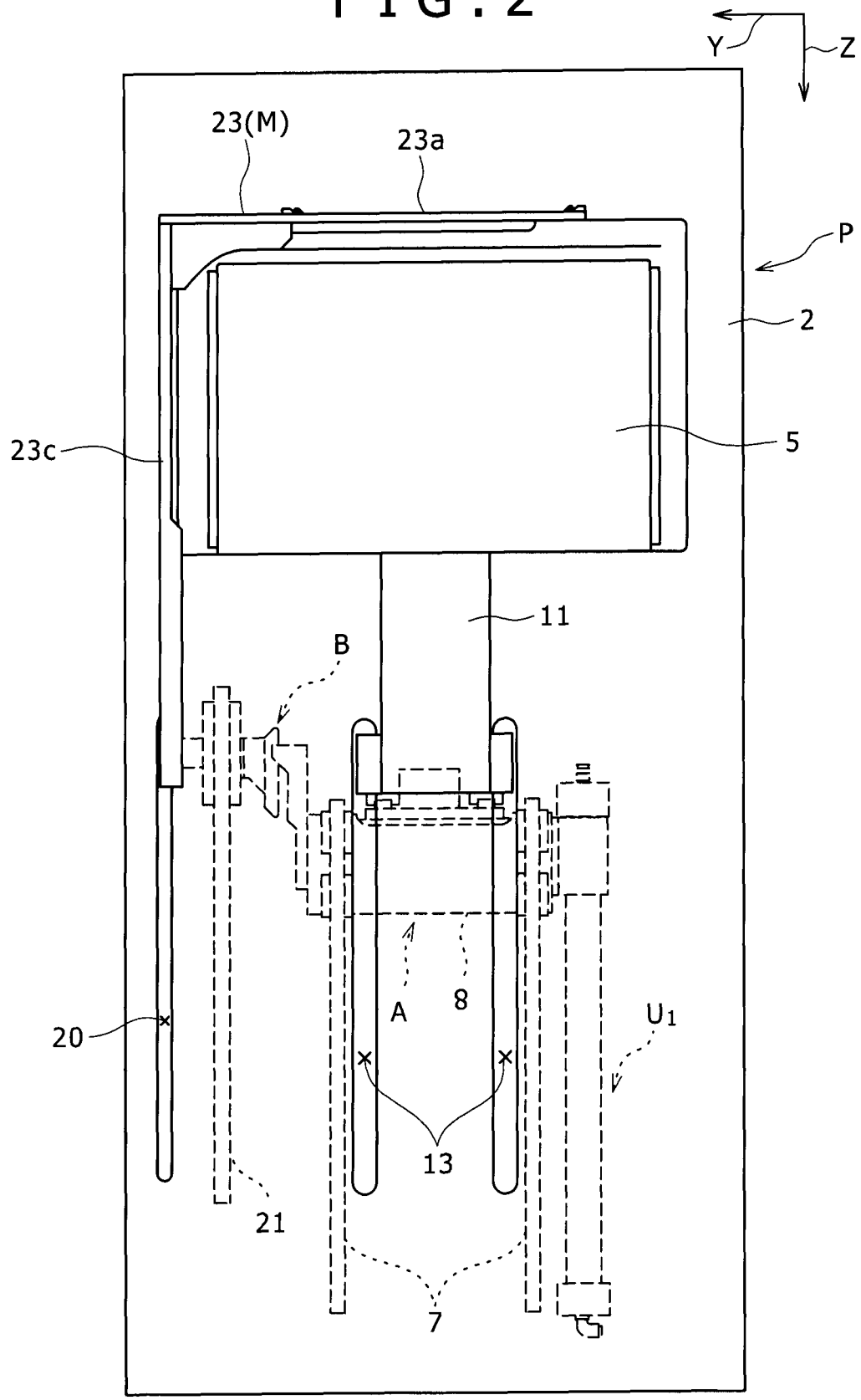
FIG. 2 is a rear elevational view of the load port apparatus.
Figure 3:
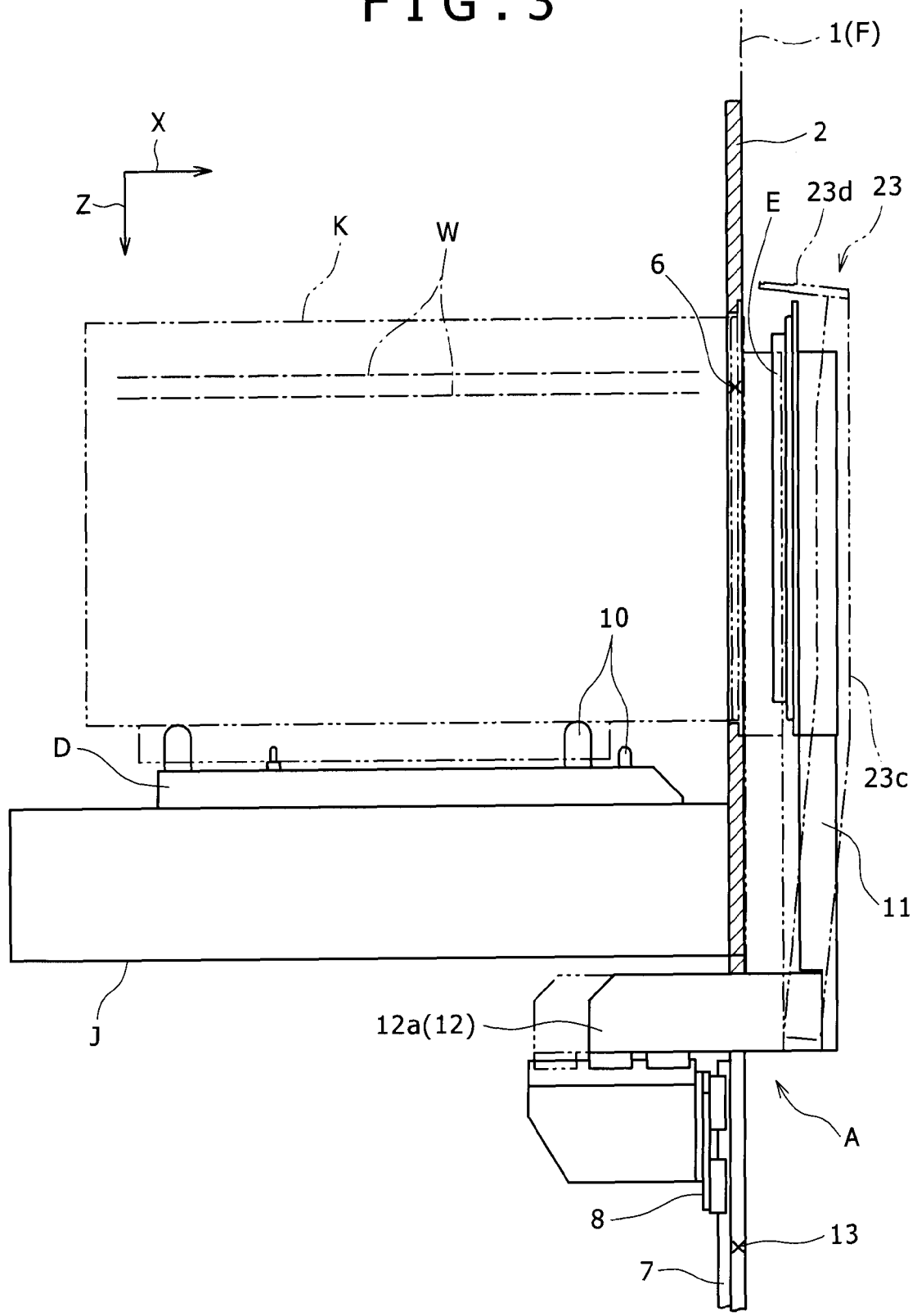
FIG. 3 is a left side elevational view of the load port apparatus principally illustrating dismounting and mounting of a lid member.

In the following, a preferred embodiment of the present invention is described in detail with reference to the accompanying drawings. It is to be noted that, in the following description, X, Y and Z directions are defined in the following manner. In particular, a direction in which a carrier base D moves on a cassette table J is defined as the X direction, and a direction in which a lid member suction plate 5 of a lid member mounting and dismounting apparatus A and a main arm 23 to which a mapping sensor $S_1$ is attached move is defined as the Z direction. Further, a direction perpendicular to the both of the X and Z directions is defined as the Y direction.

Referring first to FIGS. 1 to 8, a load port apparatus P is removably mounted on an outer wall portion 1 of a processing apparatus F for a substrate W. In particular, a load port frame 2 of the load port apparatus P is attached to the outer wall portion 1 by a plurality of bolts not shown. The load port apparatus P includes a cassette table J attached horizontally in a cantilever fashion to the load port frame 2 for receiving a carrier cassette K thereon. The load port apparatus P further includes the lid member mounting and dismounting apparatus A for dismounting and mounting a lid member E from and on an opening of a carrier cassette K placed on the cassette table J. To this end, the lid member mounting and dismounting apparatus A includes a pair of locking and unlocking mechanisms 3 for locking and unlocking the lid member E to and from the carrier cassette K and a lid member suction plate 5 including a plurality of suction cups 4. The locking and unlocking mechanisms 3 and the lid member suction plate 5 are mounted for upward and downward movement on the load port frame 2. The load port apparatus P further includes a mapping apparatus M which in turn includes a mapping sensor $S_1$ disposed for retracting movement from a mapping position with respect to a group of substrates W opposing to the opening of the carrier cassette K. The mapping sensor $S_1$ is moved upwardly and downwardly by a second lifting mechanism $U_2$ different from a first lifting mechanism $U_1$ for the lid member mounting and dismounting apparatus A to carry out mapping which is detection of presence or absence and so forth of the substrates W on individual shelves of the carrier cassette K.

An opening 6 of a rectangular shape is formed in a portion of the load port frame 2 above the cassette table J in such a manner as to allow, when the lid member E is to be dismounted from or mounted on the opening of the carrier cassette K placed on the cassette table J, the lid member E to pass therethrough so as to be disposed on the rear face side of the load port frame 2. Meanwhile, a carrier base D for positioning and setting the carrier cassette K thereon is disposed for movement in the X direction on an upper face of the cassette table J. A plurality of positioning pins 10 for positioning the carrier cassette K placed on the carrier base D are provided on an upper face of the carrier base D.

First, the lid member mounting and dismounting apparatus A is described particularly with reference to FIGS. 1 to 4. The lid member mounting and dismounting apparatus A includes an accommodation section disposed on the rear face side of the load port frame 2 and includes the first lifting mechanism $U_1$ disposed on the front face side of the load port frame 2 for moving the lid member suction plate 5, which is provided for dismounting and mounting a lid member E of a carrier cassette K placed on the cassette table J, upwardly and downwardly, that is, in the Z direction. A pair of guide rails 7 are attached in a predetermined spaced relationship from each other in the Y direction at a location of the front face of the load port frame 2 lower than the cassette table J in such a manner as to extend along the Z direction. A lifting member 8 is mounted for upward and downward movement on the guide rails 7, and a rod-less air cylinder 9 is disposed in the Z direction sidewardly of one of the guide rails 7. A slide member 9b is fitted on the outer side of a guide member 9a of the air cylinder 9 and connected to the lifting member 8. Therefore, if the slide member 9b moves upwardly or downwardly by operation of the air cylinder 9, then the lifting member 8 moves upwardly or downwardly integrally with the slide member 9b. It is to be noted that the rod-less air cylinder 9 of the first lifting mechanism $U_1$ for moving the lid member suction plate 5 upwardly and downwardly applies an air pressure to move a magnetic member not shown accommodated in the guide member 9a to move forwardly and reversely along the guide member 9a to move the slide member 9b by magnetic attracting force. An upper end position and a lower end position of the upward and downward movement of the lid member suction plate 5 are defined by positions of an upper end and a lower end of the movement of the magnetic member in the guide member 9a of the rod-less air cylinder 9. A lid member suction plate support member 12 is mounted for movement in the X direction on an upper face of the lifting member 8 and supports the lid member suction plate 5 through a pair of support rods 11 on the rear face side of the load port frame 2. The lid member suction plate support member 12 includes a pair of support member elements 12a disposed in a spaced relationship by a predetermined distance from each other in the Y direction. The support member elements 12a extend through a pair of fitting elongated holes 13 formed in the Z direction in the load port frame 2 to the rear face side of the load port frame 2. Therefore, if the lid member suction plate support member 12 is moved in the X direction by a driving mechanism not shown accommodated in the lifting member 8, then the lid member suction plate 5 moves back and forth between a standby position at which it is spaced away from the rear face of the load port frame 2 and a mounting/dismounting position at which part of the lid member suction plate 5 is fitted in the opening 6 of the load port frame 2 to carry out mounting and dismounting of the lid member E which closes up the opening of the carrier cassette K. It is to be noted that the carrier base D disposed on the cassette table J and having the carrier cassette K set thereon is moved back and forth in the X direction by a driving mechanism not shown accommodated in the cassette table J, and mounting and dismounting of the lid member E is carried out at a position at which the carrier base D is disposed nearest to the load port frame 2.

Now, the mapping apparatus M for carrying out mapping which is detection of presence or absence and so forth of substrates W accommodated on individual shelves of a carrier cassette K from which the lid member E is removed is described with reference to FIGS. 1 to 6. The mapping apparatus M includes a lift member 22, a substantially L-shaped main arm 23, an operating arm 24, and an air cylinder 25. The lift member 22 is moved back and forth in the Z direction, that is, upwardly and downwardly, by the second lifting mechanism $U_2$ along a guide rail 21 disposed in the Z direction on the front face of the load port frame 2. The main arm 23 is supported for back and forth pivotal motion within a predetermined angle around a pivotal motion axis C provided in the Y direction and has a pair of mapping sensors $S_1$ attached to a horizontal portion 23a thereof disposed in the Y direction.

The main arm 23 has a penetrating portion 23b attached integrally to a base end portion thereof and disposed substantially in the X direction. The operating arm 24 is attached to a portion of the penetrating portion 23b which is disposed on the front face side of the load port frame 2 such that it is inclined obliquely downwardly with respect to the penetrating portion 23b. The air cylinder 25 is attached integrally to the lift member 22 and has a rod 25a connected to an end portion of the operating arm 24 to pivot the main arm 23 around the pivotal motion axis C.

Figure 4:
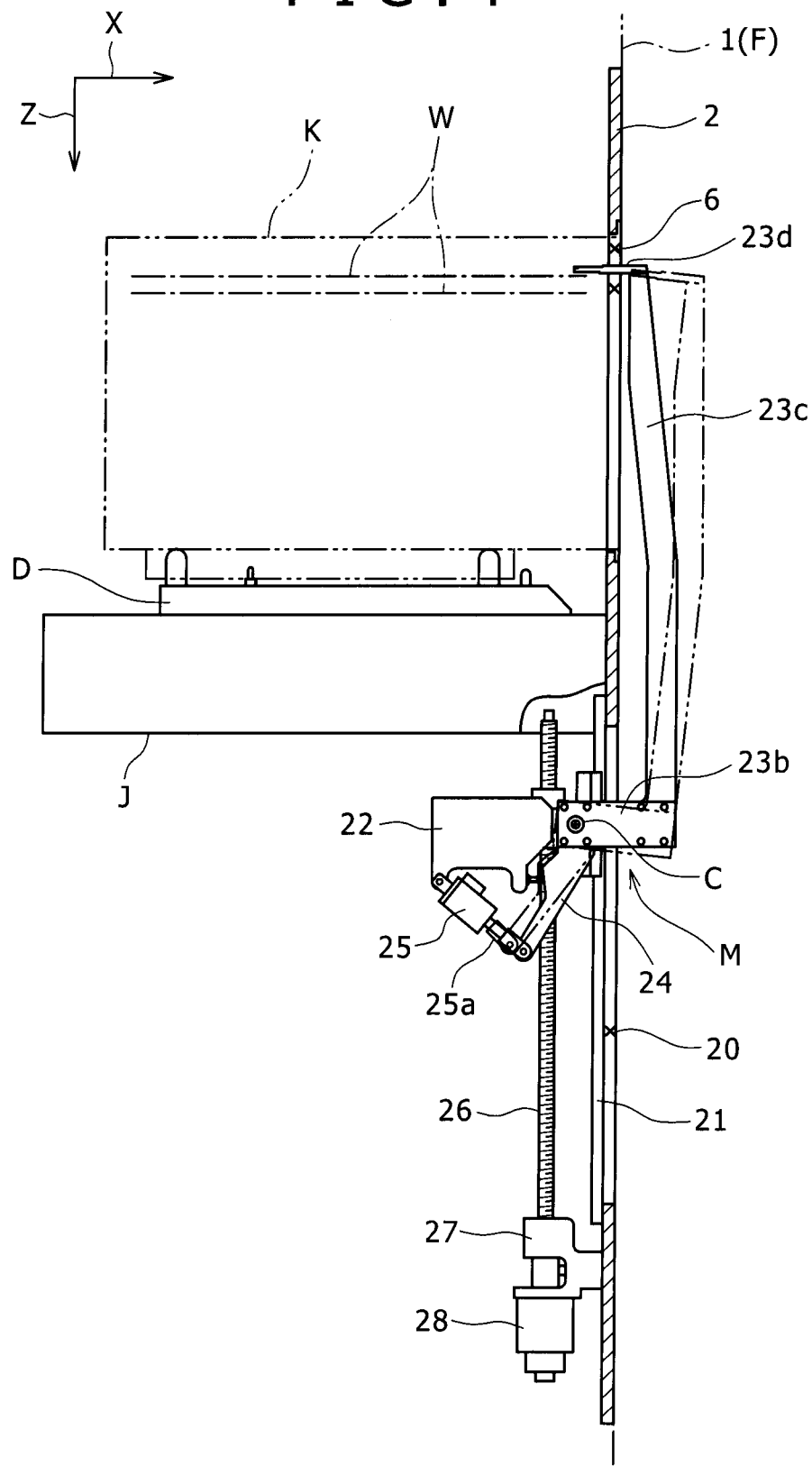
FIG. 4 is a left side elevational view of the load port apparatus principally illustrating mapping.
Figure 7:
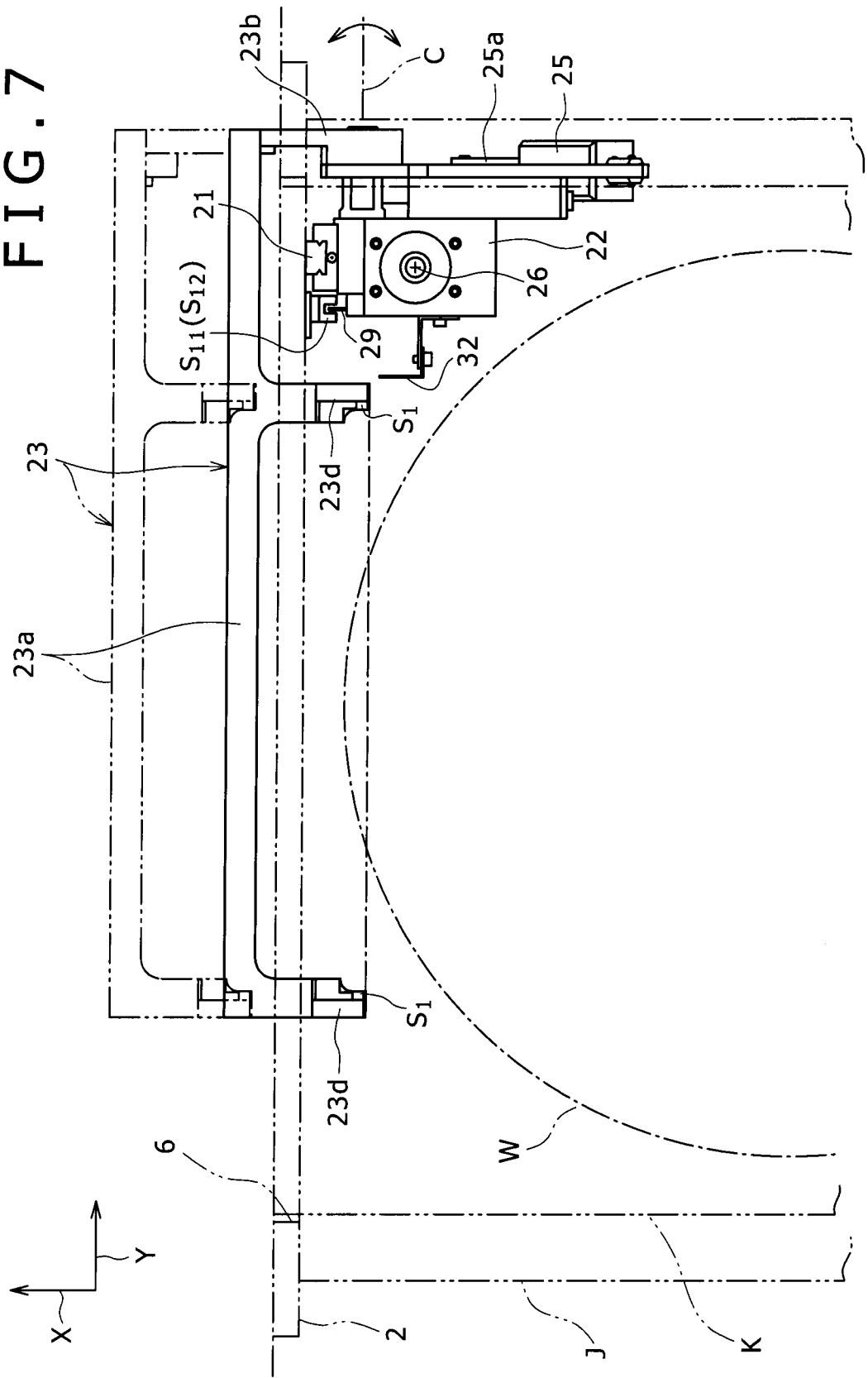
FIG. 7 is a schematic plan view principally illustrating mapping.
Figure 8:
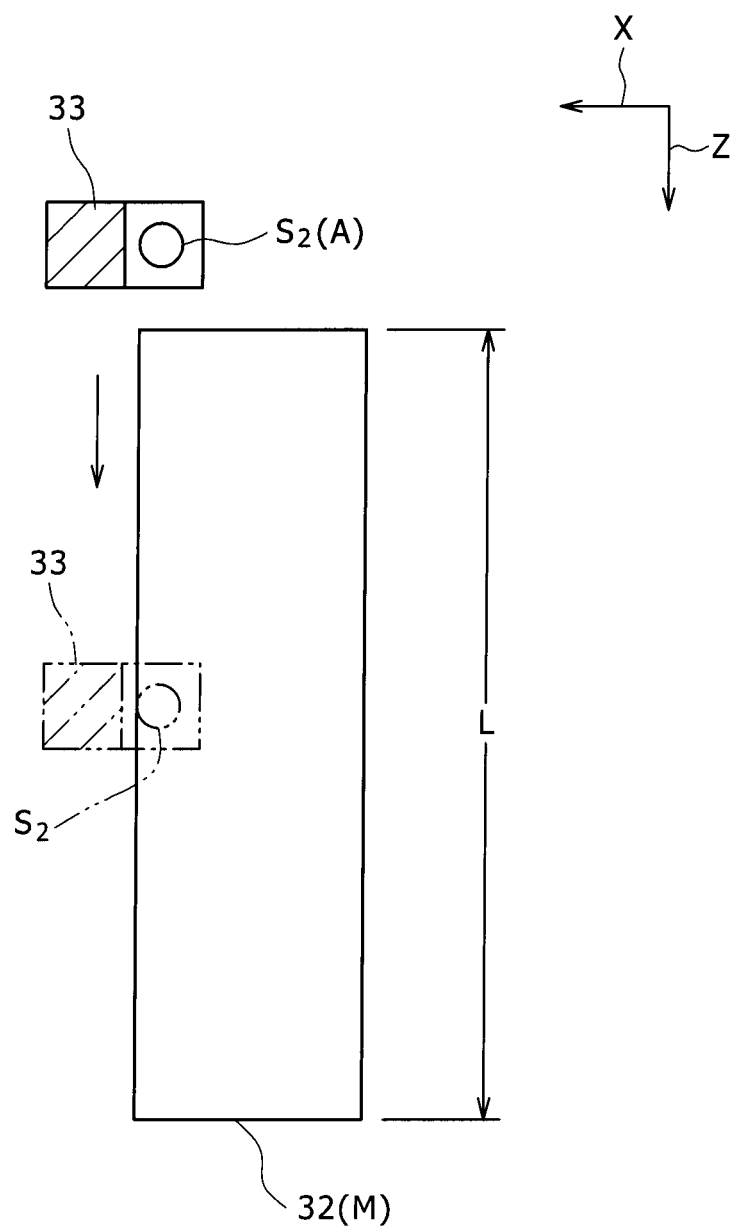
FIG. 8 is a schematic view of an interference avoiding sensor apparatus of the load port apparatus as viewed from sidewardly.

The main arm 23 is configured from three portions including a horizontal portion 23a disposed in the Y direction, a penetrating portion 23b disposed substantially in the X direction, and a vertical portion 23c disposed substantially in the Z direction and connecting the horizontal portion 23a and the penetrating portion 23b to each other. The penetrating portion 23b extends through a fitting elongated hole 20 provided in the Z direction in the load port frame 2 such that the horizontal portion 23a and the vertical portion 23c are disposed on the rear face side of the load port frame 2. On the horizontal portion 23a disposed on the rear face side of the load port frame 2, a pair of projections 23d are disposed horizontally in a spaced relationship by a predetermined distance from each other in the Y direction in such a manner as to project toward the carrier cassette K. A pair of mapping sensors $S_1$ each formed from an optical sensor are attached in an opposing relationship to each other to opposing inner side faces of end portions of the projections 23d. Therefore, in a state wherein the carrier cassette K is positioned at the taking in/out position for a substrate W and the rod 25a of the air cylinder 25 is in a retracted state as seen in FIGS. 4 and 7, the mapping sensors $S_1$ attached to the projections 23d of the penetrating portion 23b of the main arm 23 are disposed outwardly of the carrier cassette K. If, in this state, the rod 25a of the air cylinder 25 is projected, then the entire main arm 23 is pivoted around the pivotal motion axis C until the vertical portion 23c of the main arm 23 assumes a little forwardly inclined posture as indicated by solid lines in FIG. 7. Upon such pivotal potion of the main arm 23, the mapping sensors $S_1$ advance into the inside of the carrier cassette K through the opening of the carrier cassette K thereby to allow detection of presence or absence and so forth of substrates W supported on the shelves of the carrier cassette K, that is, mapping, to be carried out.

Meanwhile, the second lifting mechanism $U_2$ for moving the lift member 22 upwardly and downwardly is configured from a ball screw mechanism. A ball screw 26 which configures the second lifting mechanism $U_2$ is supported at a lower end portion thereof for rotation by a support block member 27 secured to the load port frame 2 and is supported at an intermediate portion thereof through a ball nut not shown on the lift member 22 which moves upwardly and downwardly under the guidance of the guide rail 21. However, the ball screw 26 is not supported at an upper end portion thereof. The ball screw 26 is rotated at a controlled speed by a stepping motor 28 disposed below the support block member 27. The positions of an upper end and a lower end of the upward and downward movement of the mapping sensors $S_1$ attached to the projections 23d of the horizontal portion 23a of the main arm 23, that is, the positions at an upper end and a lower end of the upward and downward movement of the lift member 22, are detected by a sensor apparatus. The sensor apparatus includes sensors $S_{11}$ and $S_{12}$ attached to the positions of the upper end and the lower end of the upward and downward movement of the lift member 22 on the surface of the load port frame 2, and a light blocking plate 29 attached integrally to the lift member 22 for passing movement between the sensors $S_{11}$ and $S_{12}$ as shown in FIG. 7. When the upward or downward movement end position of the mapping sensors $S_1$, that is, the upward or downward movement end position of the lift member 22, is detected, the stepping motor 28 is stopped in response to a detection signal from the sensor apparatus.

It is necessary to stop the main arm 23 which has the mapping sensors $S_1$ attached to the projections 23d of the horizontal portion 23a thereof, intermediately during upward or downward movement thereof, at a point of time at which the mapping sensors $S_1$ reach a position a little higher than a substrate W supported on the uppermost shelf of the carrier cassette K and dispose the main arm 23 to a mapping position at which the main arm 23 has a little forwardly inclined posture or move back the main arm 23 to a non-mapping position. Since such a temporary stopping position Q of the main arm 23 as described above is a position known in advance by calculation from the position at the upper end or the lower end of the movement of the main arm 23, it can be controlled by detection of the number of rotations of the stepping motor 28, that is, the integrated number of pulses.

Further, in a state wherein the carrier cassette K is positioned most closely to the load port frame 2, the lid member suction plate 5 of the lid member mounting and dismounting apparatus A disposed at the upward movement end position is moved toward the carrier cassette K, and the lid member E is unlocked by the locking and unlocking mechanisms 3 and attracted by the suction cups 4. Then, in this state, the lid member suction plate 5 is retracted to its original position as seen in FIG. 9A. Thereafter, if both of the lid member mounting and dismounting apparatus A and the mapping apparatus M are moved down to the temporary stopping position Q and then the lid member mounting and dismounting apparatus A is moved downwardly continuously and the main arm 23 of the mapping apparatus M is pivoted so as to assume a little forwardly inclined posture, then the horizontal portion 23a of the main arm 23 and an upper end portion of the lid member suction plate 5 will interfere with each other. Therefore, the main arm 23 cannot be pivoted to its advanced position at which mapping can be carried out.

Figure 5:
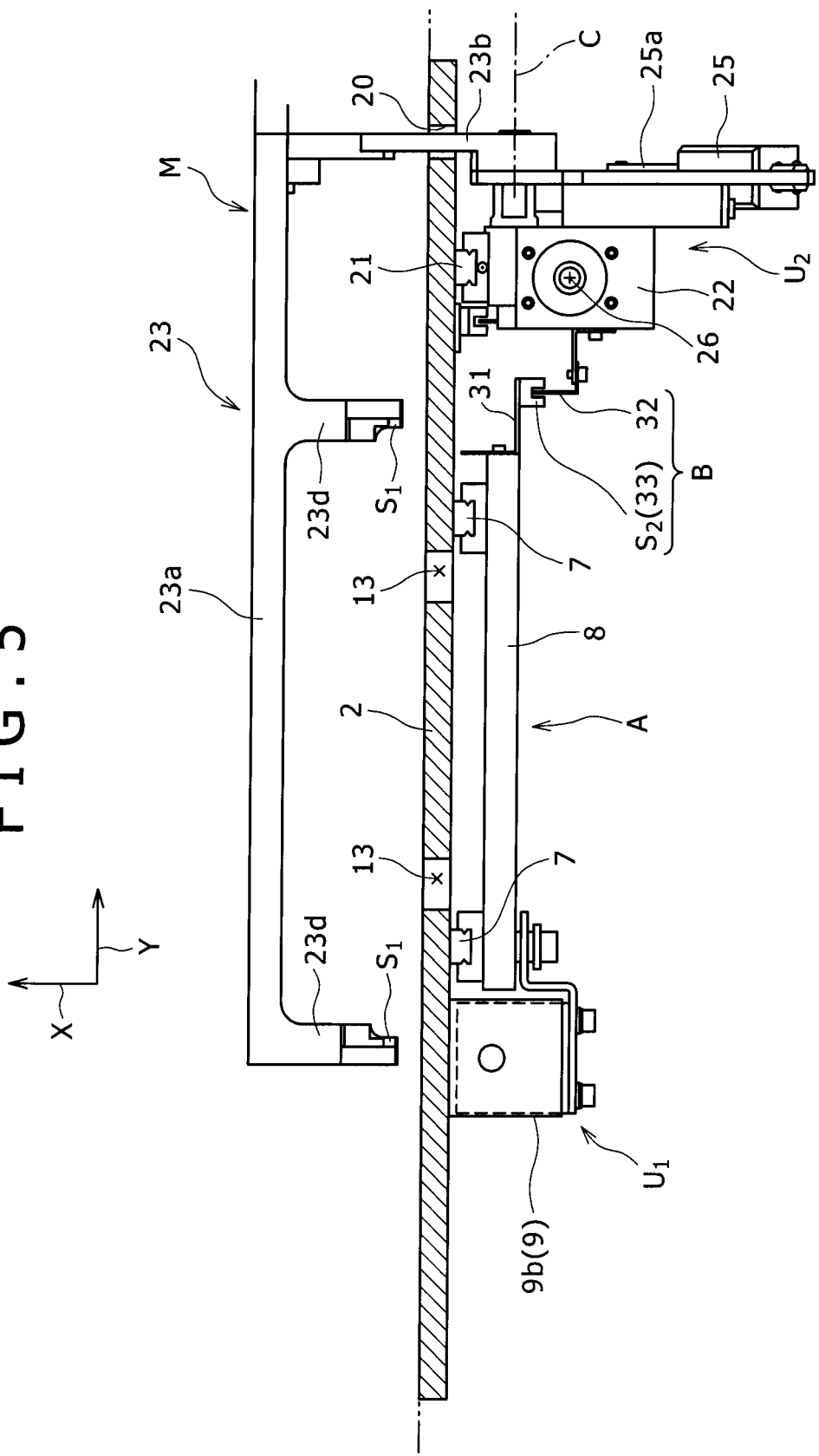
FIG. 5 is a horizontal sectional view of the load port apparatus.
Figure 6:
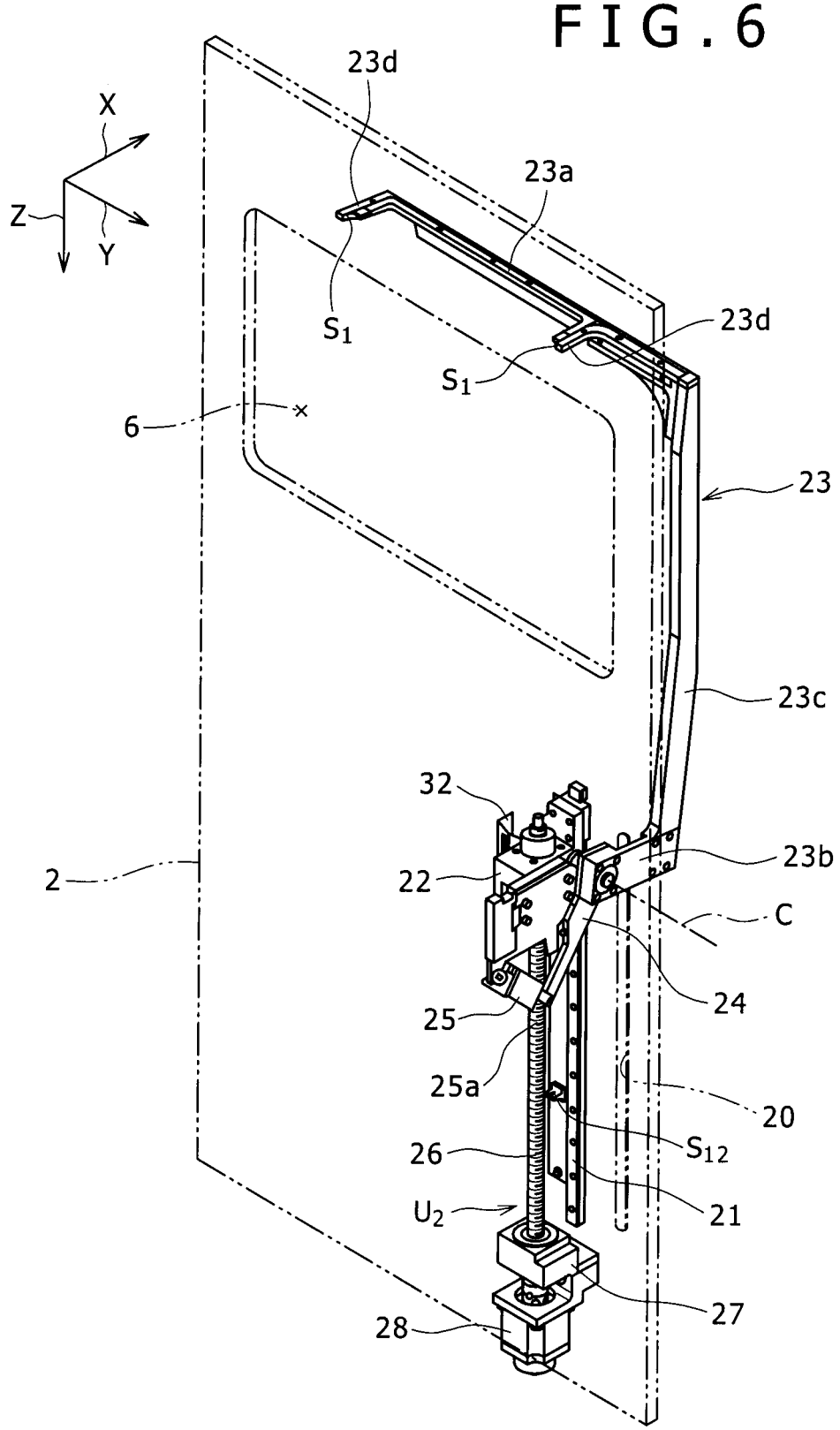
FIG. 6 is a perspective view principally showing a mapping apparatus of the load port apparatus.

Therefore, in the present invention, in order to avoid the interference described above, the following countermeasure is taken. First, it is detected that the lid member suction plate 5 of the lid member mounting and dismounting apparatus A moves down relatively to a position at which the interference of the lid member suction plate 5 of the lid member mounting and dismounting apparatus A with the mapping apparatus M can be avoided. Then, the main arm 23 to which the mapping sensors $S_1$ are attached is pivoted a little to dispose the mapping sensors $S_1$ at a mapping position to start mapping of substrates W in the carrier cassette K thereby to maximize an overlapping period of time between periods of time of operation of the lid member mounting and dismounting apparatus A and the mapping apparatus M to minimize the total operation time period of the two apparatus A and M. In particular, as seen from FIGS. 1, 5 and 8, a pair of interference avoiding sensors $S_2$ each formed from an optical sensor are attached to an end portion of the lifting member 8 of the lid member mounting and dismounting apparatus A adjacent the lid member mounting and dismounting apparatus A through a bracket 31 while a light blocking plate 32 is attached to the lifting member 22 of the mapping apparatus M for being inserted into a slot portion formed between the paired interference avoiding sensors $S_2$ to block light between the interference avoiding sensors $S_2$ such that the interference avoiding sensors $S_2$ and the light blocking plate 32 cooperatively configure an interference avoiding sensor apparatus B. In particular, a sensor attachment block 33 is attached integrally to the bracket 31 such that a recessed portion thereof is directed forwardly, and the paired interference avoiding sensors $S_2$ are attached in an opposing relationship to each other to opposing wall faces which defines the recessed portion of the sensor attachment block 33 as seen in FIG. 5. The light blocking plate 32 is disposed vertically on the load port frame 2 and has a length (L) determined such that, when the lid member mounting and dismounting apparatus A moves downwardly with respect to the mapping apparatus M which is in a stopping state, the lid member mounting and dismounting apparatus A is disposed relatively downwardly of the mapping apparatus M, that is, the lid member suction plate 5 of the lid member mounting and dismounting apparatus A is disposed relatively downwardly of the horizontal portion 23a of the main arm 23 of the mapping apparatus M, thereby to avoid the interference described above.

Figure 11:
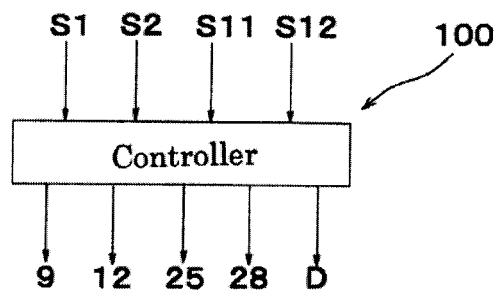
FIG. 11 is a functional block diagram of a controller used in one embodiment of the invention.

Illustrated in FIG. 11 is a controller 100 for controlling the first lifting mechanism $U_1$ for the lid member mounting and dismounting apparatus A, the second lifting mechanism $U_2$ for the mapping apparatus M, and the like. Signals are input into the controller 100 from each sensor such as the mapping sensors $S_1$, interference avoiding sensors $S_2$ and sensors $S_{11}$ and $S_{12}$. The controller 100 is programmed to output controlling signals in required timing for controlling the air cylinder 9 of the lid member mounting and dismounting apparatus A, the air cylinder 25 of the mapping apparatus M, the stepping motor 28 of the ball screw mechanism, the driving mechanism for moving the lid member suction plate support member 12 in the X direction, the driving mechanism for moving the carrier base D in the X direction and the other portions of the apparatus necessary to be controlled.

Figure 9:
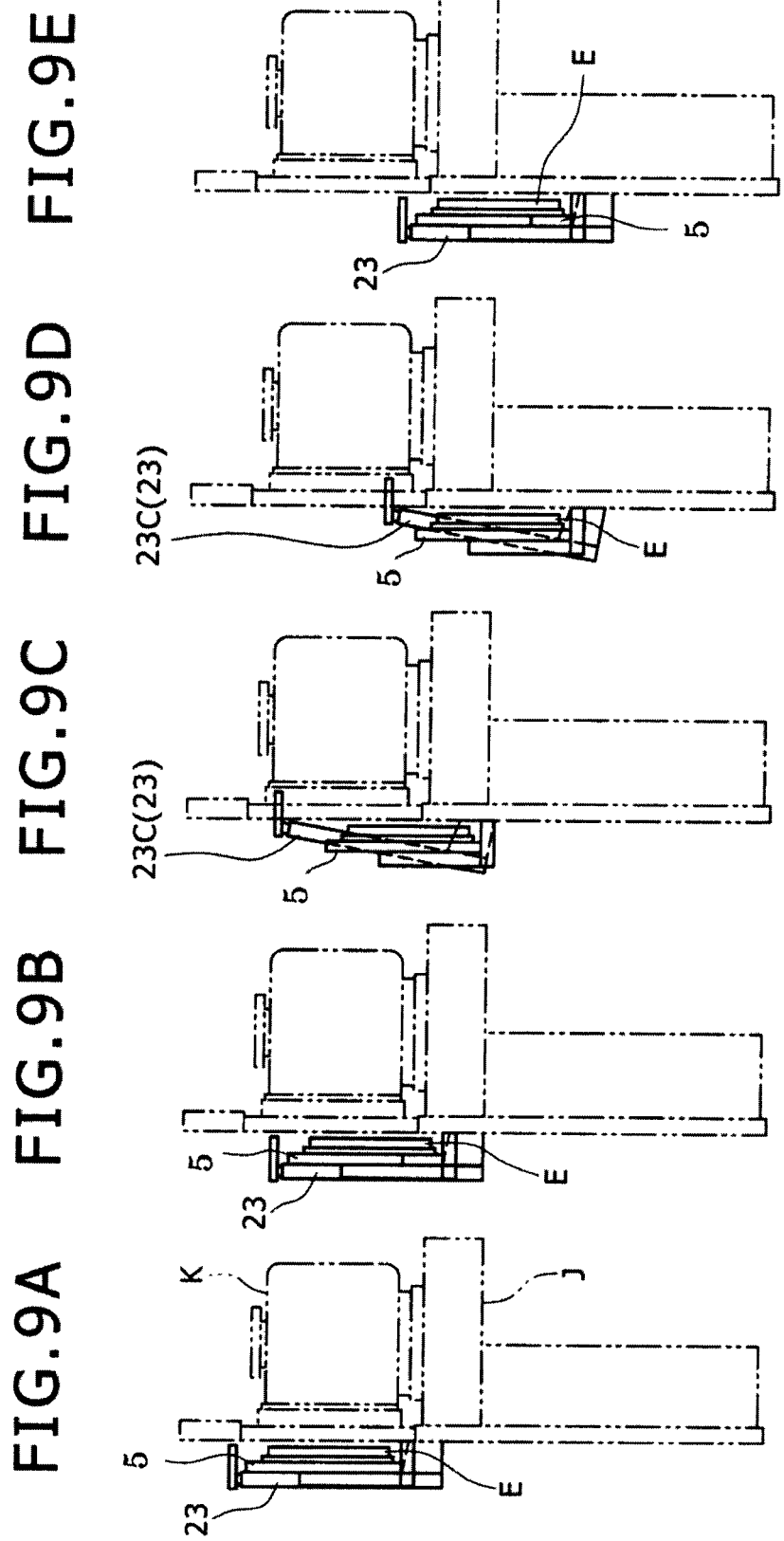
FIGS. 9A to 9E are schematic views illustrating different stages of operation of the load port apparatus.

Now, mapping which is carried out by the mapping apparatus M of substrates W supported on the shelves in the carrier cassette K while the lid member suction plate 5 of the lid member mounting and dismounting apparatus A and the main arm 23 of the mapping apparatus M are moved down after the lid member E of the carrier cassette K placed on the cassette table J is removed is described with reference to FIGS. 9 and 10. It is necessary to set the downwardly moving speed $V_1$ of the lid member suction plate 5 upon downward movement of the lid member suction plate 5 of the lid member mounting and dismounting apparatus A and the main arm 23 of the mapping apparatus M to a speed equal to or a little higher than the downwardly moving speed $V_2$ of the main arm 23 to which the mapping sensors $S_1$ are attached. In the embodiment, it is assumed that the downwardly moving speed $V_1$ of the lid member suction plate 5 and the downwardly moving speed $V_2$ of the main arm 23 are equal to each other in order to facilitate illustration and description. FIG. 9A illustrates a state wherein the carrier cassette K is positioned nearest to the load port frame 2 as a result of the forward movement of the carrier base D and both of the lid member suction plate 5 and the main arm 23 are positioned at the upward movement end position. In this state, the lid member suction plate 5 is moved forwardly until the suction cups 4 are closely contacted with the front face of the lid member E and the lid member E is unlocked from the carrier cassette K by the locking and unlocking mechanisms 3, whereafter the lid member suction plate 5 to which the lid member E is attracted is moved back. Thereafter, the air cylinder 9 of the first lifting mechanism $U_1$ is rendered operative to start downward movement of the lid member suction plate 5, to which the lid member E is attracted, at the downwardly moving speed $V_1$, and simultaneously the ball screw mechanism of the second lifting mechanism $U_2$ is rendered operative to start downward movement also of the main arm 23 of the mapping apparatus M at the downwardly moving speed $V_2$ equal to the downwardly moving speed $V_1$. Thus, although the lid member suction plate 5 moves continuously down to the lower end movement position, the main arm 23 temporarily stops once at the temporary stopping position Q a little higher than the substrate W on the highest shelf in the carrier cassette K as seen in FIG. 9B. As described hereinabove, the temporary stopping position Q can be detected by the integrated number of pulses to the stepping motor 28 which configures the ball screw mechanism.

Then, during stopping of the main arm 23 at the temporary stopping position Q, the lid member suction plate 5 continues the downward movement. Then, when the interference avoiding sensors S2 on the lid member mounting and dismounting apparatus A side which configure the interference avoiding sensor apparatus B pass the lower end of the light blocking plate 32 on the mapping apparatus M side and the interference avoiding sensor apparatus B is turned "OFF", that is, at a point of time at which the lid member suction plate 5 reaches the position at which it is disposed downwardly by a preset value relative to the main arm 23 and does not interfere with forwardly inclining movement of the main arm 23, the rod 25a of the air cylinder 25 of the mapping apparatus M is projected so that the main arm 23 assumes a little forwardly inclined posture, in which the mapping sensors $S_1$ enters the carrier cassette K and come to the mapping position at which mapping of the substrates W by the mapping sensors $S_1$ can be carried out as seen in FIG. 9C. In this state, the stepping motor 28 is started to move the main arm 23 downwardly to carry out mapping of the substrates W on the shelves of the carrier cassette K. Then, at a point of time at which the mapping sensors $S_1$ reach a position a little downwardly of the substrate W on the lowermost shelf, the stepping motor 28 is stopped to stop the downward movement of the main arm 23 as seen in FIG. 9D. It is to be noted that the position a little downwardly of the substrate W on the lowermost shelf reached by the mapping sensors $S_1$ is the downward movement end position of the mapping apparatus M, and the lid member suction plate 5 reaches the downward movement end thereof while mapping of the substrates W by the mapping sensor $S_1$ attached to the horizontal portion 23a of the main arm 23 is being carried out. Finally, the rod 25a of the air cylinder 25 is retracted to allow the main arm 23 to return to its original position, that is, to its non-mapping position, as seen in FIG. 9E. It is to be noted that the relative arrangement relationship of the lid member mounting and dismounting apparatus A and the mapping apparatus M at the downward movement end position in the Z direction, that is, in the upward and downward direction, is similar to that at the upward movement end position. Therefore, during downward movement of the lift member 22 of the mapping apparatus M, light of the interference avoiding sensors S2 attached to the lifting member 8 of the lid member mounting and dismounting apparatus A which has reached already and stops at the downward movement position is blocked by the light blocking plate 32 of the interference avoiding sensor apparatus B. However, the interference avoiding sensor apparatus B is set so as to be disabled when the lid member E is removed from the carrier cassette K, and therefore, the main arm 23 of the mapping apparatus moves down to the downward movement end position without any trouble.

Figure 10:
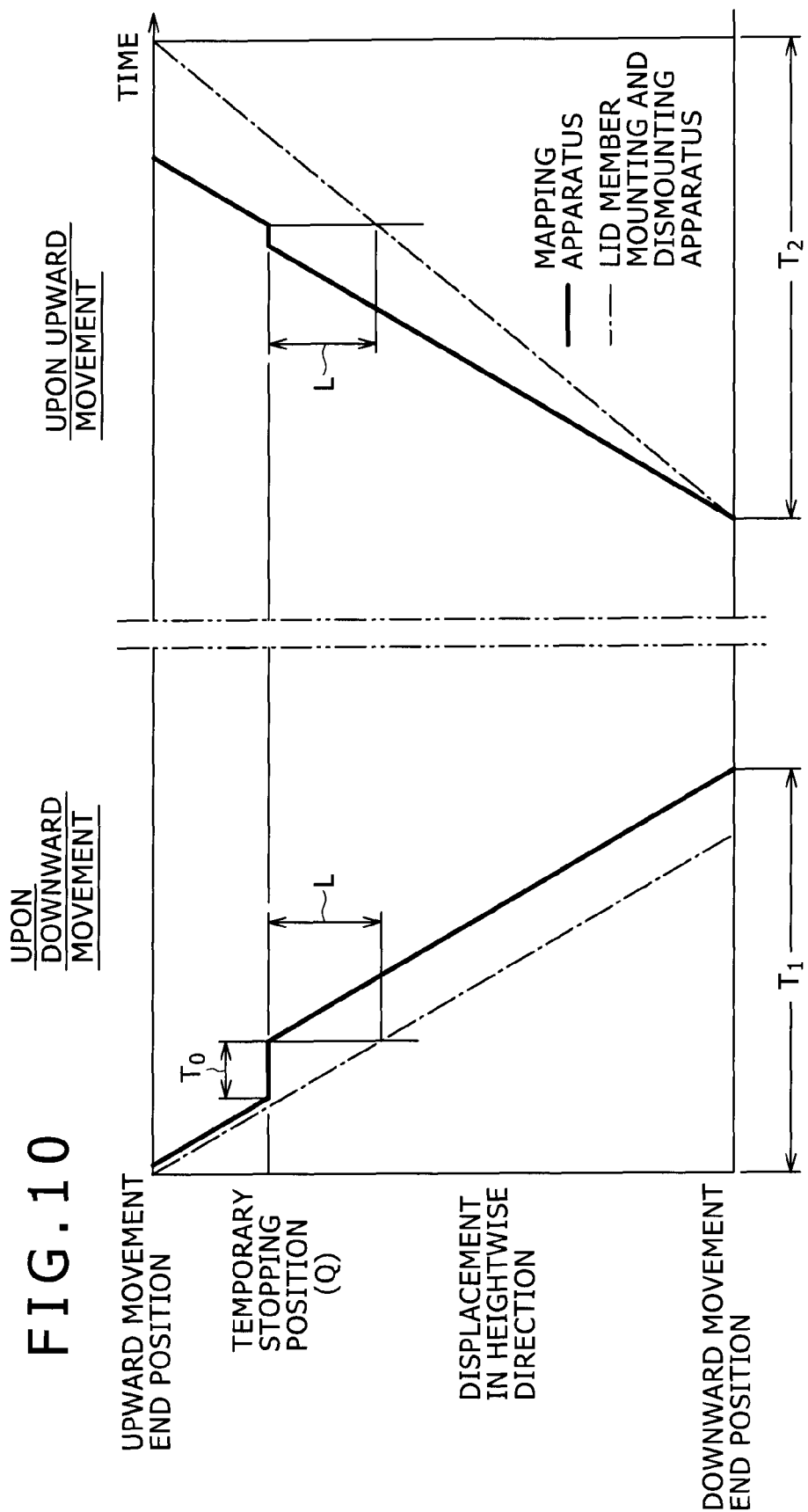
FIG. 10 is a graph illustrating a positional relationship of a lid member mounting and dismounting apparatus and the mapping apparatus of the load port apparatus with respect to time upon downward and upward movement of the two apparatus.

Therefore, since the lid member mounting and dismounting apparatus A and the mapping apparatus M start downward movement at the same time at the same speed as seen in FIG. 10, the total operation time period of both apparatus A and M is equal to the operation time period ($T_1$) of the mapping apparatus M. Further, the stopping time period ($T_0$) of the mapping apparatus M at the temporary stopping position Q is a period of time in which the difference (L) in height of the lid member mounting and dismounting apparatus A from the mapping apparatus M at the point of time of the end of the stopping, that is, at the point of time at which pivotal motion of the main arm 23 is started, becomes equal to the length (L) of the light blocking plate 32 which configures the interference avoiding sensor apparatus B. Further, since, in the embodiment described above, the downwardly moving speed $V_1$ of the lid member suction plate 5 and the downwardly moving speed $V_2$ of the main arm 23 are equal to each other, or in other words, since the downwardly moving speed $V_1$ of the lid member suction plate 5 is minimized while the total operation time period of both apparatus A and M is kept fixed, vibration or the like caused by downward movement of the lid member suction plate 5 can be minimized. Therefore, there is an advantage that the mapping accuracy is enhanced.

Then, after the mapping of the substrates W in the carrier cassette K is completed, each of the substrates W is taken out from the carrier cassette K, taken into the processing apparatus F and subjected to predetermined processing while another substrate W after processed is accommodated into the original shelf in an empty state of the carrier cassette K.

On the other hand, upon upward movement of the lid member suction plate 5 and the main arm 23, the upwardly moving speed $V_3$ of the lid member suction plate 5 is set lower than the downwardly moving speed $V_2$ of the main arm 23=$V_1$ in order to avoid interference between the main arm 23 and the lid member suction plate 5, that is, $V_2 > V_3$. First, at the downward movement end position of the mapping apparatus M, the rod 25a of the air cylinder 25 is projected to place the main arm 23 into a little forwardly inclined posture and the mapping sensors $S_1$ are disposed to the mapping position for the substrates W in the carrier cassette K. Thereafter, the stepping motor 28 is rotated in the direction opposite to that upon downward movement to move the main arm 23 upwardly to carry out mapping of the substrates W. Then if the mapping sensors $S_1$ reach the temporary stopping position Q a little upwardly of the substrate W of the uppermost shelf, then the stepping motor 28 stops. Immediately after this, the rod 25a of the air cylinder 25 is retracted so that the main arm 23 is permitted to return to the non-mapping position. Thereafter, the stepping motor 28 is rendered operative again to move the main arm 23 to the upward movement end position. The air cylinder 9 of the lid member mounting and dismounting apparatus A is rendered operative simultaneously with the starting of the mapping by the mapping apparatus M. In other words, although the lid member suction plate 5 starts upward movement thereof simultaneously with the main arm 23 of the mapping apparatus M, due to the difference in speed described above, the difference in displacement in the heightwise direction between the main arm 23 and the lid member suction plate 5 increases as the time elapses. By the accumulation of the difference in displacement, even if the main arm 23 starts upward movement toward the upward movement end position after it stops for a little while at the temporary stopping position Q and returns to the non-mapping position thereof, the main arm 23 comes to the upward movement end position earlier than the lid member suction plate 5. At the upward movement end position, the lid member suction plate 5 which has the lid member E attracted thereto advances toward the carrier cassette K to close up the opening of the carrier cassette K with the lid member E.

On the other hand, although the downwardly moving speed $V_1$ and the upwardly moving speed $V_3$ of the lid member suction plate 5 can be set to arbitrary speeds as far as the conditions described above are satisfied from a relationship to the downwardly moving speed $V_2$ and the upwardly moving speed $V_2$ of the main arm 23 of the mapping apparatus M.

However, the downwardly moving speed $V_1$ of the lid member suction plate 5 which must satisfy the condition that it is equal to or higher than the downwardly moving speed $V_2$ of the main arm 23 is preferably proximate to the downwardly moving speed $V_2$ of the main arm 23 in order to prevent generation of vibrations. On the other hand, while the upwardly moving speed $V_3$ of the lid member suction plate 5 must satisfy the condition that it is lower than the downwardly moving speed $V_2$, in order to shorten the total operation time period of the lid member mounting and dismounting apparatus A and the mapping apparatus M, preferably the upwardly moving speed $V_3$ of the lid member suction plate 5 is proximate to the downwardly moving speed $V_2$ of the main arm 23.

The present application contains subject matter related to that disclosed in Japanese Priority Patent Application JP 2009-163347 filed in the Japan Patent Office on Jul. 10, 2009, the entire content of which is hereby incorporated by reference.

It should be understood by those skilled in the art that various modifications, combinations, sub-combinations and alterations may occur depending on design requirements and other factor in so far as they are within the scope of the appended claims or the equivalents thereof.

What is claimed is:

1. A load port apparatus, comprising:
a cassette table, disposed horizontally on a load port frame, and configured to receive a carrier cassette;
a lid member detaching mechanism configured to detach a lid member from the carrier cassette, said lid member detaching mechanism comprising:
a lid member suction plate including an unlocking mechanism configured to unlock the lid member from the carrier cassette placed on said cassette table and a suction cup configured to attach to the lid member; and
a first elevator mechanism configured to vertically move the lid member suction plate;
a mapping mechanism configured to map substrates in the carrier cassette, the mapping mechanism comprising:
an arm having a horizontal portion and a vertical portion;
an optical mapping sensor, attached to said horizontal portion of said arm and projecting toward the carrier cassette, said optical mapping sensor configured to detect the substrates in the carrier cassette;
a pivot mechanism configured to pivotally move said arm around a horizontal pivotal axis provided in parallel to said horizontal portion of said arm whereby the optical mapping sensor is moved to a mapping position in the carrier cassette; and
a second elevator mechanism configured to vertically move the arm and the pivot mechanism; and
an interference avoiding sensor configured to detect that a vertical distance between said lid member suction plate and said arm exceeds a preset value and to enable the pivotal motion of said arm; wherein
said arm is pivotally moved to move the optical mapping sensor to the mapping position to start the mapping of the substrates in the carrier cassette in response to the detection by the interference avoiding sensor.

2. The load port apparatus according to claim 1, wherein said interference avoiding sensor comprises
a light blocking member of a predetermined length in a vertical direction provided on one of either said mapping mechanism or said lid member detaching mechanism, and
an optical sensor provided on the other one of either said mapping mechanism or said lid member detaching mechanism, configured to detect said light blocking member therebetween.

3. The load port apparatus according to claim 2, wherein said first elevator mechanism of said lid member detaching mechanism comprises an air cylinder, and
said second elevator mechanism of said mapping mechanism comprises a ball screw mechanism.

4. The load port apparatus according to claim 1, further comprising:
a controller configured to control the first and second elevator mechanisms and the pivot mechanism, wherein
the first elevator mechanism is controlled to continuously move downward the lid member suction plate at a constant speed while the second elevator mechanism is controlled to move downward the arm at a speed equal to or lower than the constant speed, to temporarily stop the arm to position the optical mapping sensor at a certain position above a substrate supported on an uppermost shelf in the carrier cassette and to resume the downward movement of the arm in response to the detection by the interference avoiding sensor that the vertical distance between the lid member suction plate and the arm exceeds the preset value, and wherein
the pivot mechanism is controlled to pivotally move the arm in response to the detection by the interference avoiding sensor whereby the optical mapping sensor is moved to the mapping position in the carrier cassette and starts the mapping of the substrates in the carrier cassette.

5. The load port apparatus according to claim 4, wherein the controller further controls the first and second elevator mechanisms to move upward the lid member suction plate and the arm,
the speed of the upward movement of the lid member suction plate being lower than the speed of the upward movement of the arm.

6. The load port apparatus according to claim 5, wherein the lid member suction plate and the arm start the upward movement at the same time.

7. The load port apparatus according to claim 4, wherein the lid member suction plate and the arm start the downward movement at the same speed at the same time.

8. A load port apparatus, comprising:
a lid opening mechanism configured to open a lid of a carrier cassette;
a first elevator mechanism configured to vertically move the lid opening mechanism;
a mapping sensor configured to map substrates in the carrier cassette, said mapping sensor being movable between a mapping position inside the carrier cassette and a retracted position outside the carrier cassette;
a driving mechanism configured to move the mapping sensor between the mapping position and the retracted position;
a second elevator mechanism configured to vertically move the mapping sensor; and
a position sensor configured to detect that a vertical distance between the lid opening mechanism and the mapping sensor exceeds a certain distance,
the driving mechanism moving the mapping sensor from the retracted position to the mapping position in response to the detection by the position sensor whereby the mapping sensor starts the mapping operation in the carrier cassette.

9. The load port apparatus according to claim 8, further comprising a controller configured to control the first and second elevator mechanisms wherein the first elevator mechanism is controlled to move downward the lid opening mechanism continuously from its upper limit position to its lower limit position while the second elevator mechanism is controlled to move downward the mapping sensor from its upper limit position and to temporarily stop the mapping sensor at an intermediate position at which the mapping sensor is ready for detecting a substrate stored in an uppermost shelf in the carrier cassette, the controller further controlling the second elevator mechanism to resume the downward movement of the mapping sensor from the intermediate position in response to the detection by the position sensor, whereby the mapping sensor maps the substrates in the carrier cassette.

10. A load port apparatus, comprising:

lid opening means for opening a lid of a carrier cassette;

first elevating means for vertically moving the lid opening means;

mapping means for mapping substrates in the carrier cassette, said mapping means being movable between a mapping position inside the carrier cassette and a retracted position outside the carrier cassette;

driving means for moving the mapping means between the mapping position and the retracted position;

second elevating means for vertically moving the mapping means; and position sensing means for detecting that a vertical distance between the lid opening means and the mapping means exceeds a certain distance, the driving means moving the mapping means from the retracted position to the mapping position in response to the detection by the position sensing means whereby the mapping means starts the mapping operation in the carrier cassette.

11. A method for controlling a load port apparatus, the method comprising:

controlling a lid opening mechanism to open a lid of a carrier cassette;

controlling a first elevator mechanism to continuously move downward the lid opening mechanism at a constant speed;

controlling a mapping sensor to map substrates in the carrier cassette, said mapping sensor being movable between a mapping position inside the carrier cassette and a retracted position outside the carrier cassette;

controlling a second elevator mechanism to move downward the mapping sensor at a speed equal to or less than the constant speed, to temporarily stop the mapping sensor at a certain vertical position above a substrate supported on an uppermost shelf in the carrier cassette and to resume the downward movement of the mapping sensor when a vertical distance between the lid opening mechanism and the mapping sensor exceeds a certain distance; and controlling a driving mechanism to move the mapping sensor from the retracted position to the mapping position when the vertical distance between the lid opening mechanism and the mapping sensor exceeds the certain distance whereby the mapping sensor starts the mapping operation in the carrier cassette.

12. The method according to claim 11, further comprising:

controlling the first and second elevator mechanisms to move upward the lid opening mechanism and the mapping sensor wherein the speed of the upward movement of the lid opening mechanism is lower than the speed of the upward movement of the mapping sensor.

\* \* \* \* \*